US008936949B2

(12) United States Patent
Karakida (10) Patent No.: US 8,936,949 B2
(45) Date of Patent: Jan. 20, 2015

(54) SOLAR CELL AND MANUFACTURING METHOD THEREOF (75) Inventor: Shoichi Karakida, Tokyo (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 339 days.

(21) Appl. No.: 13/388,517

(22) PCT Filed: Aug. 26, 2009

(86) PCT No.: PCT/JP2009/064858
§ 371 (c)(1),
(2), (4) Date: Feb. 2, 2012

(87) PCT Pub. No.: WO2011/024264
PCT Pub. Date: Mar. 3, 2011

(65) Prior Publication Data
US 2012/0125420 A1  May 24, 2012

(51) Int. Cl.
*H01L 21/66* (2006.01)
*H01L 21/00* (2006.01)
*H01L 31/0224* (2006.01)
*H01L 31/068* (2012.01)
*G01R 31/26* (2014.01)

(52) U.S. Cl.
CPC ...... *H01L 31/022433* (2013.01); *H01L 31/068* (2013.01); *G01R 31/2605* (2013.01); *Y02E 10/547* (2013.01)
USPC .............................................. 438/17; 438/57

(58) Field of Classification Search
None
See application file for complete search history.

(56) References Cited

U.S. PATENT DOCUMENTS 4,218,650 A * 8/1980 Frosch et al. ................. 324/719
4,228,315 A * 10/1980 Napoli ........................... 136/256
4,256,513 A * 3/1981 Yoshida et al. ............... 136/256
(Continued)

FOREIGN PATENT DOCUMENTS

JP  55-139560 U  10/1980
JP  9-027632 A   1/1997
(Continued)

OTHER PUBLICATIONS

International Search Report (PCT/ISA/210) issued on Sep. 29, 2009, by Japanese Patent Office as the International Searching Authority for International Application No. PCT/JP2009/064858.
(Continued)

*Primary Examiner* — Scott B Geyer
(74) *Attorney, Agent, or Firm* — Buchanan Ingersoll & Rooney PC (57) ABSTRACT A manufacturing method of a solar cell in which a light receiving side electrode including grid electrodes is provided on one side of a semiconductor substrate, comprises: a first step of forming an impurity diffusion layer on one side of the semiconductor substrate of a first conductivity type, the diffusion layer having a second conductivity-type impurity diffused therein; a second step of measuring a sheet resistance value of the diffusion layer at a plurality of measurement points in a surface of the diffusion layer; and a third step of dividing the surface of the diffusion layer into a plurality of areas corresponding to the measured sheet resistance values of the surface of the diffusion layer, setting a distance between adjacent grid electrodes for each of the areas, and forming the light receiving side electrode, which is electrically connected to the diffusion layer, on the diffusion layer.

9 Claims, 9 Drawing Sheets

(56) References Cited

U.S. PATENT DOCUMENTS

| | | | |
|---|---|---|---|
| 4,628,144 A * | 12/1986 | Burger | 136/256 |
| 5,716,480 A | 2/1998 | Matsuyama et al. | |
| 2007/0193621 A1 * | 8/2007 | Brabec et al. | 136/246 |
| 2008/0314444 A1 * | 12/2008 | Kawaguchi | 136/256 |

FOREIGN PATENT DOCUMENTS

| | | |
|---|---|---|
| JP | 2008-135655 A | 6/2008 |
| JP | 2009-099574 A | 5/2009 |

OTHER PUBLICATIONS

Written Opinion (PCT/ISA/237) issued on Sep. 29, 2009, by Japanese Patent Office as the International Searching Authority for International Application No. PCT/JP2009/064858.

J. Lindmayer et al., "An Improved Silicon Solar Cell—The Violet Cell", 1972, IEEE Photovoltaic Specialists Conference, pp. 83-84.

* cited by examiner

SOLAR CELL AND MANUFACTURING METHOD THEREOF

FIELD

The present invention relates to a solar cell and a manufacturing method thereof, particularly to a solar cell excellent in photoelectric conversion efficiency and a manufacturing method thereof.

BACKGROUND

Conventionally, a bulk-type solar cell is typically manufactured by the following method. First, for example, a p-type silicon substrate is prepared as a first conductivity-type substrate, and, after removing a damage layer of the silicon surface, which is generated when making slicing from a cast ingot, for example, by a thickness of 10 μm to 20 μm with a few to 20 wt. % sodium hydroxide or sodium hydrogen carbonate, anisotropic etching is performed with a solution in which IPA (isopropyl alcohol) is added to a similar low-concentrated alkaline solution to form a texture so that a silicon (111) surface is exposed.

Next, the substrate is treated, for example, for tens of minutes at 800 to 900° C., for example, in a mixed gas atmosphere of phosphorous oxychloride ($POCl_3$), nitrogen, and oxygen to form an n-type layer as a second conductivity-type impurity layer uniformly on the entire surface. A favorable electrical property of a solar cell is obtained by setting a sheet resistance of the n-type layer uniformly formed on the silicon surface to about 30 to 80 Ω/□. Thereafter, the substrate is immersed in a hydrofluoric acid solution to etch away glassy material (PSG) deposited on the surface during a diffusion process.

Next, the n-type layer formed in an unnecessary area on the back surface and the like of the substrate is removed. Removal of the n-type layer is performed by immersing the substrate, for example, in a 20 wt % potassium hydroxide solution for a few minutes after causing polymer resist paste to adhere to the light receiving side of the substrate in a screen printing method and drying it for protecting the n-type layer formed on the light receiving side of the substrate. Thereafter, the resist is removed by an organic solvent. As another method of removing the n-type layer on the back surface and the like of this substrate, there is a method of performing end-face separation by laser or dry etching at the end of the process.

Next, a dielectric film, such as a silicon oxide film, a silicon nitride film or a titanium oxide film, is formed on the surface of the n-type layer with a uniform thickness as a dielectric film (anti-reflective film) for preventing reflection. When a silicon nitride film is formed as the anti-reflective film, for example, the film is formed by a plasma CVD method under reduced pressure at 300° C. or higher using $SiH_4$ gas and $NH_3$ gas as raw materials. The refractive index of the anti-reflective film is about 2.0 to 2.2 and the optimum film thickness is about 70 nm to 90 nm. It is to be noted that the anti-reflective film formed in such a manner is an insulator, so that this does not function as a solar cell in a situation that only a front side electrode is formed on this film.

Next, with the use of masks for forming grid electrodes and bus electrodes, silver paste to be a front side electrode is applied onto the anti-reflective film in the form of the grid electrodes and the bus electrodes in the screen printing method, and is dried.

Next, back aluminum electrode paste to be a back aluminum electrode and back silver paste to be back silver bus electrodes are applied to the back surface of the substrate in the form of the back aluminum electrode and in the form of the back silver bus electrodes, respectively, in the screen printing method, and are dried.

Next, the electrode paste applied to the front and back surfaces of the silicon substrate is fired simultaneously for a few minutes at about 600° C. to 900° C. Consequently, the grid electrodes and the bus electrodes are formed as front side electrodes on the anti-reflective film, and the back aluminum electrode and the back silver bus electrodes are formed as back side electrodes on the back surface of the silicon substrate. On the front side of the silicon substrate, while the anti-reflective film is melted by a glass material contained in the silver paste, a silver material comes into contact with the silicon and is re-solidified. Therefore, conduction between the front side electrode and the silicon substrate (n-type layer) is secured. Such a process is called a fire-through method. Moreover, the back aluminum electrode paste also reacts with the back surface of the silicon substrate to form a p+ layer immediately beneath the back aluminum electrode.

CITATION LIST

Non Patent Literature

Non Patent Literature 1: J. Lindmayer & J. Allison "AN IMPROVED SILICON SOLAR CELL—THE VIOLET CELL" IEEE Photovoltaic Specialists Conference 9th p. 83

SUMMARY

Technical Problem

For improving the efficiency of the bulk-type solar cell manufactured in the above-mentioned manner, the pattern of the front side electrode is important. One parameter for the pattern design of the front side electrode is a sheet resistance value after formation of the n-type layer. Conventionally, an optimum inter-grid-electrode distance is set for a sheet resistance value in a certain position of the n-type layer or, when sheet resistance values are measured in several points in the surface of the n-type layer, for a representative value thereof, and this set value is uniformly applied to the whole light receiving surface in the solar cell.

However, in the impurity diffusion process of forming the n-type layer, variation occurs in the degree of diffusion of impurity in each impurity diffusion process lot, so that variation in the sheet resistance value occurs. Moreover, even in one solar cell, variation in the degree of diffusion of impurity occurs in the surface of the n-type layer, so that variation (in-plane distribution) in the sheet resistance value occurs.

Such variation in the degree of diffusion of impurity partially depends on a diffusion apparatus and a diffusion condition. Therefore, variation (in-plane distribution) in the sheet resistance value in the surface of the n-type layer often exhibits a similar tendency in each impurity diffusion process lot.

As one method of further improving the efficiency of the bulk-type solar cell as described above, for example, a technology of performing sub-micron dimensional etching on the surface of the n-type layer has been reported (for example, refer to Non Patent Literature 1). Its objective is to remove the outermost layer of the n-type layer called dead layer. The dead layer is a layer in which the impurity density near the surface of the n-type layer is about $1021$ $cm^{-3}$, and becomes a factor of decreasing the photoelectric conversion efficiency of the solar cell because the dead layer shortens the life of positive holes that are minority carriers. However, removal of this dead layer further increases variation (in-plane distribution) in the sheet resistance value in the surface of the n-type layer.

In other words, as described above, there is variation (in-plane distribution) in the sheet resistance value in the surface of the n-type layer. For this reason, there has been a problem in that the inter-grid-electrode distance uniformly applied to the whole surface of the light receiving surface as in the conventional technology is not an optimum value in the whole surface of the light receiving surface and thus, uniform application of the inter-grid-electrode distance becomes a factor of decreasing the photoelectric conversion efficiency.

The present invention is achieved in view of the above, and has an object to obtain a solar cell excellent in photoelectric conversion efficiency and a manufacturing method thereof.

Solution to Problem

In order to solve the above-mentioned problem and achieve an object, the present invention provides a manufacturing method of a solar cell in which a light receiving side electrode including grid electrodes is provided on one side of a semiconductor substrate, comprising: a first step of forming an impurity diffusion layer on one side of the semiconductor substrate of a first conductivity type, the diffusion layer having a second conductivity-type impurity diffused therein; a second step of measuring a sheet resistance value of the impurity diffusion layer at a plurality of measurement points in a surface of the impurity diffusion layer; and a third step of dividing the surface of the impurity diffusion layer into a plurality of areas corresponding to the measured sheet resistance values of the surface of the impurity diffusion layer, setting a distance between adjacent grid electrodes for each of the areas, and forming the light receiving side electrode, which is electrically connected to the impurity diffusion layer, on the impurity diffusion layer.

Advantageous Effects of Invention

According to the present invention, an effect is obtained in which even if there is a variation (in-plane distribution) in the sheet resistance value in the surface of the n-type impurity diffusion layer, the photoelectric conversion efficiency of the solar cell can be increased, and therefore the solar cell excellent in photoelectric conversion efficiency can be obtained.

BRIEF DESCRIPTION OF DRAWINGS

FIG. 1-1 is a top view of a solar cell according to an embodiment of the present invention as seen from a light receiving side.

FIG. 1-2 is a bottom view of the solar cell according to the embodiment of the present invention as seen from the opposite side of the light receiving surface.

FIG. 1-3 is a main-portion cross-sectional view of the solar cell according to the embodiment of the present invention in an A-A direction in FIG. 1-2.

FIG. 3-1 is a cross-sectional view for explaining one example of the manufacturing process of the solar cell according to the embodiment of the present invention.

FIG. 3-2 is a cross-sectional view for explaining one example of the manufacturing process of the solar cell according to the embodiment of the present invention.

FIG. 3-3 is a cross-sectional view for explaining one example of the manufacturing process of the solar cell according to the embodiment of the present invention.

FIG. 3-4 is a cross-sectional view for explaining one example of the manufacturing process of the solar cell according to the embodiment of the present invention.

FIG. 3-5 is a cross-sectional view for explaining one example of the manufacturing process of the solar cell according to the embodiment of the present invention.

FIG. 3-6 is a cross-sectional view for explaining one example of the manufacturing process of the solar cell according to the embodiment of the present invention.

DESCRIPTION OF EMBODIMENTS

An embodiment of a solar cell and a manufacturing method thereof according to the present invention will be described below in detail based on the drawings. The present invention is not limited to the following description and can be appropriately changed without departing from the scope of the present invention. Moreover, in the following drawings, the scale of each member is different from a realistic one in some cases for easy understanding. The same thing can be said between the drawings.

Embodiment

Figure 11:
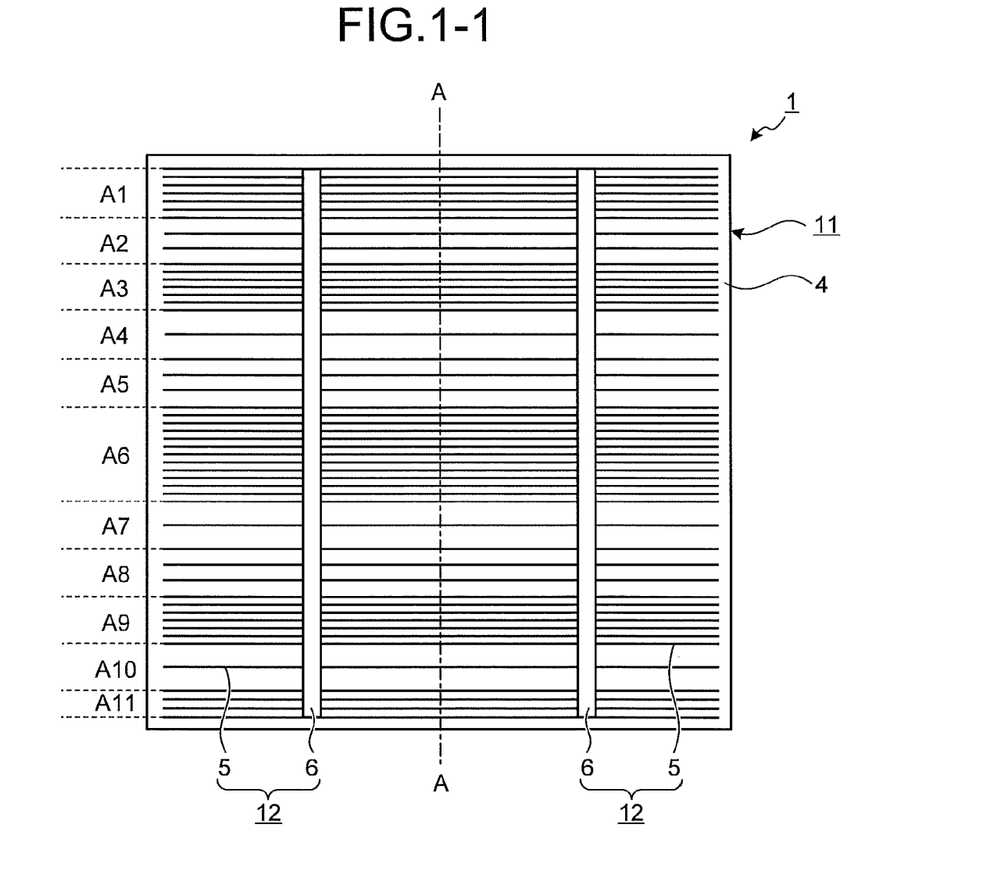
Figure 12:
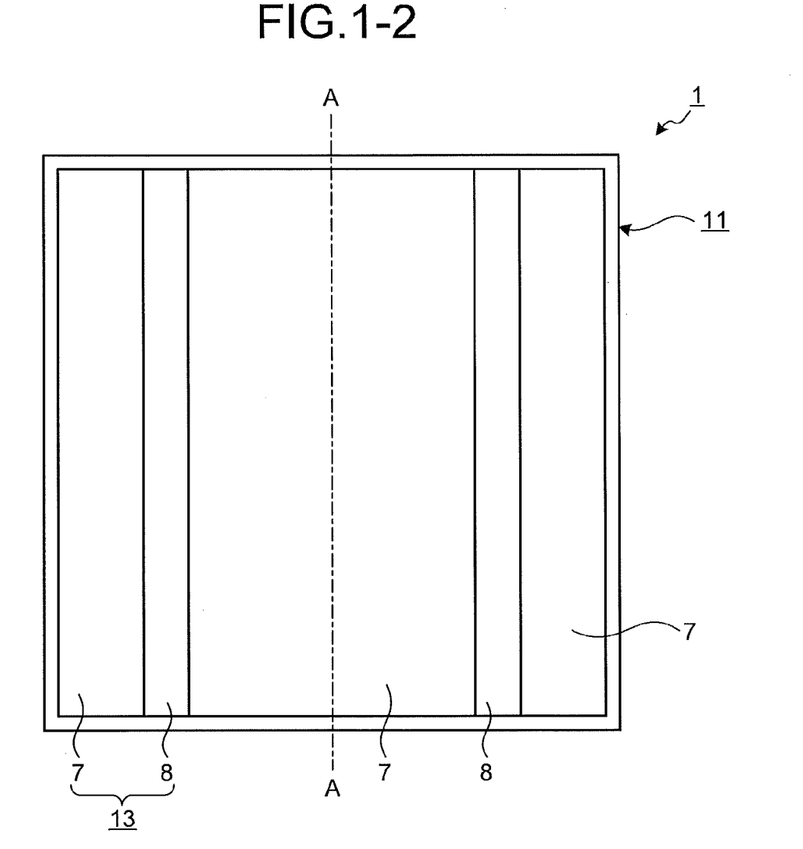
Figure 13:
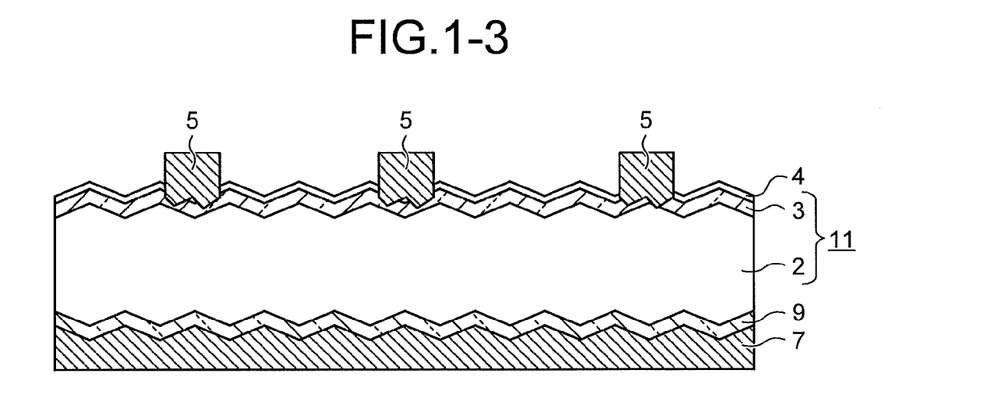

FIG. 1-1 to FIG. 1-3 are views for explaining a configuration of a solar cell 1 according to the embodiment of the present invention, of which FIG. 1-1 is a top view of the solar cell 1 as seen from a light receiving side, FIG. 1-2 is a bottom view of the solar cell 1 as seen from the opposite side of the light receiving surface, and FIG. 1-3 is a main-portion cross-sectional view of the solar cell 1 in an A-A direction in FIG. 1-2.

In the solar cell 1 according to the embodiment, an n-type impurity diffusion layer 3 is formed by diffusing phosphorus into the light receiving side of a semiconductor substrate 2 made of p-type monocrystalline silicon to form a semiconductor substrate 11 having a p-n junction and an anti-reflective film 4 formed of a silicon nitride film (SiN film) is formed on the n-type impurity diffusion layer 3. The semiconductor substrate 2 is not limited to the p-type monocrystalline silicon substrate, but a p-type polycrystalline silicon substrate, an n-type polycrystalline silicon substrate, or an n-type monocrystalline silicon substrate may be used therefor.

Moreover, on the surface on the light receiving side of the semiconductor substrate 11 (the n-type impurity diffusion layer 3), minute projections and recesses are formed as a texture structure. The minute projections and recesses have a structure to increase the area for absorbing light from outside in the light receiving surface and thereby to reduce the reflectance on the light receiving surface, and to trap the light.

The anti-reflective film 4 is formed of a dielectric film such as a silicon nitride film (SiN film), a silicon oxide film ($SiO_2$ film), and a titanium oxide film ($TiO_2$ film). On the light receiving side of the semiconductor substrate 11, a plurality of long narrow front silver grid electrodes 5 are arranged side by side and front silver bus electrodes 6 in electrical conduction to the front silver grid electrodes 5 are provided to be substantially orthogonal to the front silver grid electrodes 5, and each of them is electrically connected to the n-type impurity diffusion layer 3 in their bottom surface portions. The front silver grid electrodes 5 and the front silver bus electrodes 6 are made of a silver material.

The front silver grid electrodes 5 are made of a silver (Ag) based material, and have, for example, a width of about 100 μm to 200 μm and a height of about 5 μm to 20 μm and are arranged approximately parallel to each other at predetermined intervals, and collect electricity generated in the semiconductor substrate 11. Moreover, the front silver bus electrodes 6 are made of a silver (Ag) based material, and have, for example, a width of about 0.5 mm to 3 mm. For example, about two to five front silver bus electrodes 6 are arranged per one solar cell. The front silver bus electrodes 6 take electricity, which is collected in the front silver grid electrodes 5, to the outside. A light-receiving side electrode 12 as a first electrode is formed of the front silver grid electrode 5 and the front silver bus electrodes 6. The light-receiving side electrode 12 is desirably formed having an area as small as possible in terms of improvement of the power generation efficiency because the light-receiving side electrode 12 blocks the sunlight entering the semiconductor substrate 11, and is typically formed in arrangement of the comb-shaped front silver grid electrodes 5 and the bar-like front silver bus electrodes 6 as shown in FIG. 1-1.

As an electrode material of the light-receiving side electrode of the silicon solar cell, silver paste is commonly used, and for example, lead-boron glass is added thereto. This glass is in the form of frit and has a composition of, for example, 5 to 30 wt % lead (Pb), 5 to 10 wt % boron (B), 5 to 15 wt % silicon (Si), and 30 to 60 wt % oxygen (O), and moreover, zinc (Zn), cadmium (Cd) or the like may be mixed therewith by about a few wt % in some cases. Such lead-boron glass has characteristics of melting by heating at several hundreds ° C. (for example, 800° C.) and eating away silicon at that time. Moreover, typically, in the manufacturing method of a crystalline silicon type solar cell, a method of obtaining an electrical contact between a silicon substrate and silver paste by using the characteristics of glass frit is used.

On the other hand, on the whole back surface (a surface on the opposite side of the light receiving surface) of the semiconductor substrate 11, a back aluminum electrode 7 made of an aluminum material is provided, and back silver electrodes 8, which extend substantially in the same direction as the front silver bus electrodes 6 and are made of a silver material, are provided. A back side electrode 13 as a second electrode is formed of the back aluminum electrode 7 and the back silver electrodes 8. In the back aluminum electrode 7, a BSR (Back Surface Reflection) effect of reflecting long-wavelength light passing through the semiconductor substrate 11 to reuse it for power generation is expected.

In terms of low cost and performance increase, it is common to use silver as a material of the light-receiving side electrode 12 as above, and to use aluminum as a material of the back side electrode and, if necessary, a silver-based material for part of the area of the back side electrode.

Moreover, on the surface layer portion on a side of the back surface (a surface on the opposite side of the light receiving surface) of the semiconductor substrate 11, a p+ layer (BSF (Back Surface Filed)) 9 containing high concentration impurity is formed. The p+ layer (BSF) 9 is provided for yielding the BSF effect, so that electron concentration of the p-type layer (the semiconductor substrate 2) is increased by the electric field of a band structure so as not to discreate electrons in the p-type layer (the semiconductor substrate 2).

In the solar cell 1 configured in such a manner, when the p-n junction surface (junction surface between the semiconductor substrate 2 and the n-type impurity diffusion layer 3) of the semiconductor substrate 11 is irradiated with the sunlight from the light receiving side of the solar cell 1, holes and electrons are generated. The generated electrons move toward the n-type impurity diffusion layer 3 and holes move toward the p+ layer 9 due to the electric field of the p-n junction portion. Consequently, electrons become excessive in the n-type impurity diffusion layer 3 and holes become excessive in the p+ layer 9, so that photovoltaic power is generated. This photovoltaic power is generated in a direction in which the p-n junction is biased forward, and the light-receiving side electrode 12 connected to the n-type impurity diffusion layer 3 becomes a negative electrode and the back aluminum electrode 7 connected to the p+ layer 9 becomes a positive electrode, so that current flows in a not-shown external circuit.

In the solar cell 1 according to the present embodiment configured as above, variation (in-plane distribution) is present in the sheet resistance value of the surface in a plane of the n-type impurity diffusion layer 3. This variation (in-plane distribution) in the sheet resistance value is caused due to variation in the degree of diffusion of impurity in the impurity diffusion process of forming the n-type impurity diffusion layer 3. There is a correlative relationship among the photoelectric conversion efficiency of the solar cell 1, the inter-grid-electrode distance that is the distance between the front silver grid electrodes 5 adjacent to each other in the longitudinal direction of the front silver bus electrode 6, and the sheet resistance value of the n-type impurity diffusion layer 3.

Then, in the solar cell 1, based on measurement values for the sheet resistance value of the surface of the n-type impurity diffusion layer 3, the n-type impurity diffusion layer 3 or the light receiving surface is divided into areas, i.e., an area A1 to an area A11 in the longitudinal direction of the front silver bus electrode 6, and the adjacent front silver grid electrodes 5 are arranged such that the inter-grid-electrode distance, which is the distance between the front silver grid electrodes 5 adjacent in the longitudinal direction of the front silver bus electrode 6, is set to be different for each area.

Specifically, in the solar cell 1, the inter-grid-electrode distance, which is the distance between the adjacent front silver grid electrodes 5, is not constant in the cell surface, and the inter-grid-electrode distance is set in the cell surface so that the inter-grid-electrode distance becomes an appropriate value corresponding to the sheet resistance value of the surface of the n-type impurity diffusion layer 3. Therefore, in the solar cell 1, the inter-grid-electrode distance is not uniform in the cell surface as shown in FIG. 1-1, and portions having a long inter-grid-electrode distance and portions having a short inter-grid-electrode distance are mixed.

In this manner, in the solar cell 1, the front silver grid electrodes 5 are arranged such that the inter-grid-electrode distance is set to a value appropriate for each sheet resistance value in the surface of the n-type impurity diffusion layer 3 corresponding to variation (in-plane distribution) in the sheet resistance value in the surface of the n-type impurity diffusion layer 3, thereby improving the photoelectric conversion efficiency, so that the solar cell having a high photoelectric conversion efficiency is realized.

In the present embodiment, the sheet resistance value of the surface of the n-type impurity diffusion layer 3 is a sheet resistance value of the surface of the light receiving surface, which is measured at any of (1) a point when the n-type impurity diffusion layer 3 is formed in the manufacturing process of the solar cell, (2) a point when a glassy (phosphosilicate glass, PSG: Phospho-Silicate Glass) layer formed on the surface of the n-type impurity diffusion layer 3 is removed after forming the n-type impurity diffusion layer 3, and (3) a point when the dead layer (the outermost layer of the n-type impurity diffusion layer 3) is slightly removed after removing the glassy layer.

Specifically, the sheet resistance value measured at the timing of the above (1) is the sheet resistance value of the surface of the glassy layer formed on the n-type impurity diffusion layer 3. Moreover, the sheet resistance value measured at the timing of the above (2) is the sheet resistance value of the surface of the dead layer formed on the outermost layer of the n-type impurity diffusion layer 3. Furthermore, the sheet resistance value measured at the timing of the above (3) is the sheet resistance value of the surface of the n-type impurity diffusion layer 3 from which the dead layer has been removed. The sheet resistance values measured at these three kinds of timings become different values even at the same position, but they have the same tendency in variation (in-plane distribution) in the surface of the n-type impurity diffusion layer 3.

The dead layer is a layer in which the impurity density near the surface of the n-type impurity diffusion layer 3 is about $10^{21}$ cm$^{-3}$, and becomes a factor of decreasing the photoelectric conversion efficiency of the solar cell because the dead layer shortens the life of holes (positive holes) as minority carriers. In the solar cell 1, the anti-reflective film 4 and the light-receiving side electrodes 12 are provided directly on the n-type impurity diffusion layer 3 and such a dead layer is not present on the outermost surface of the n-type impurity diffusion layer 3, so that decrease in the photoelectric conversion efficiency of the solar cell due to the dead layer is prevented.

In the above, explanation is given for the case where the dead layer is surely removed, but the effect of increasing the photoelectric conversion efficiency according to the present invention can be obtained even in the case where the dead layer remains on the surface of the n-type impurity diffusion layer 3 regardless of the decrease in the photoelectric conversion efficiency due to the dead layer.

Figure 2:
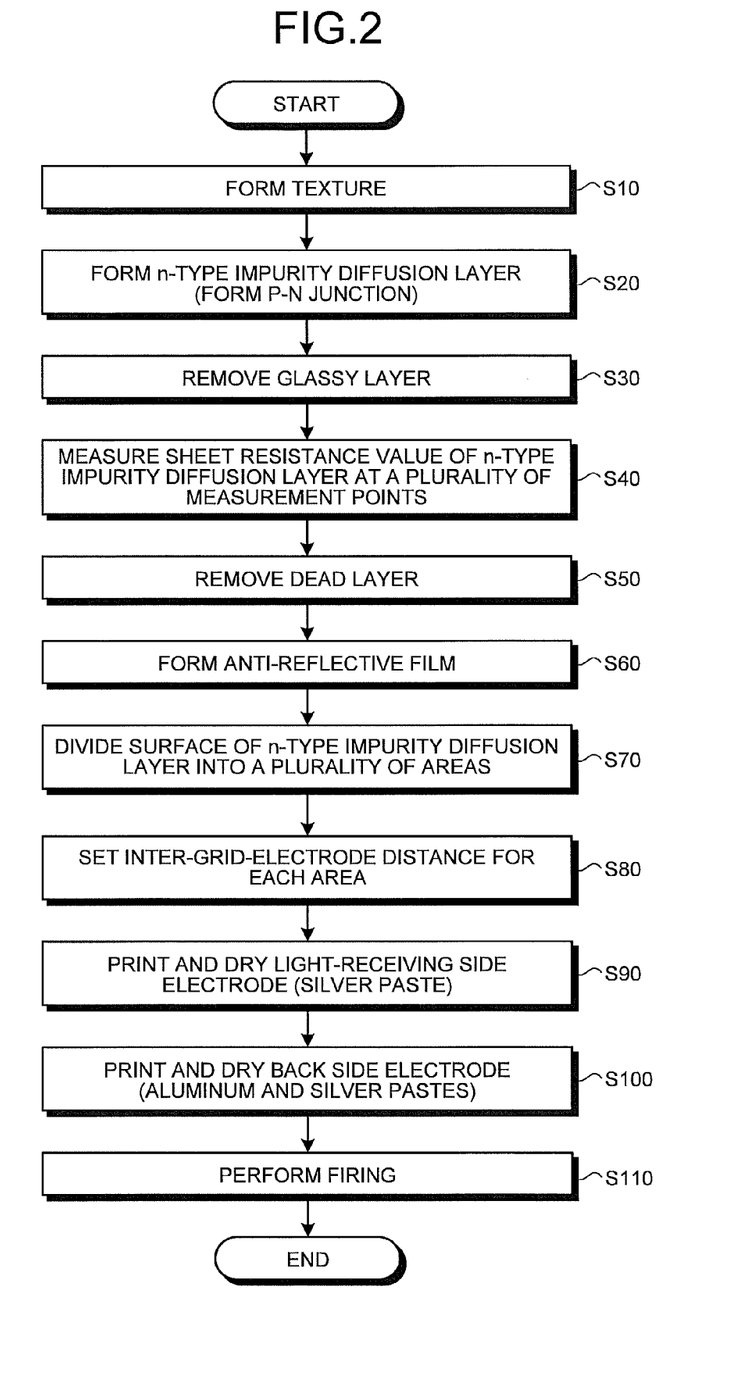
FIG. 2 is a flowchart for explaining one example of a manufacturing process of the solar cell according to the embodiment of the present invention.

The manufacturing method of the solar cell 1 according to the present embodiment is described below with reference to the drawings. FIG. 2 is a flowchart for explaining one example of the manufacturing process of the solar cell 1 according to the embodiment of the present invention. FIG. 3-1 to FIG. 3-6 are cross-sectional views for explaining one example of the manufacturing process of the solar cell 1 according to the embodiment of the present invention.

Figure 31:
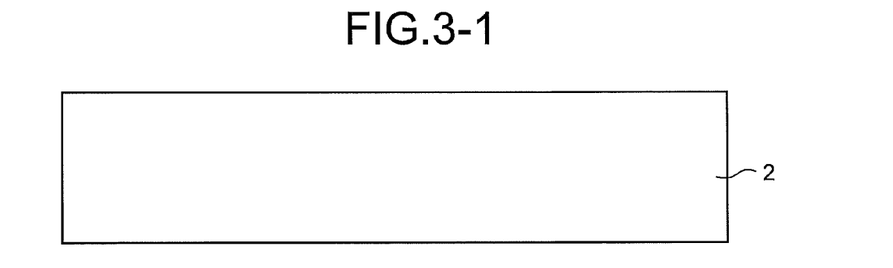

First, a p-type monocrystalline silicon substrate, for example, with several hundreds µm in thickness is prepared as the semiconductor substrate 2 (FIG. 3-1). The p-type monocrystalline silicon substrate is manufactured by slicing an ingot which has been formed by cooling and solidifying a molten silicon material, with a wire saw, so that damage at the time of the slicing remains on the surface of the substrate. Therefore, the surface is etched by immersing the p-type monocrystalline silicon substrate in an acid or heated alkaline solution, for example, a sodium hydroxide solution to remove the damaged area that is caused at the time of cutting for the silicon substrate and is present near the surface of the p-type monocrystalline silicon substrate. For example, the surface is removed by a thickness of 10 µm to 20 µm with a few to 20 wt % sodium hydroxide or sodium hydrogen carbonate. The p-type silicon substrate used for the semiconductor substrate 2 may be any of monocrystal or polycrystal, but in this embodiment, a p-type monocrystalline silicon substrate of (100) plane direction, whose specific resistance is 0.1 Ω·cm to 5 Ω·cm, is described as an example.

Figure 32:
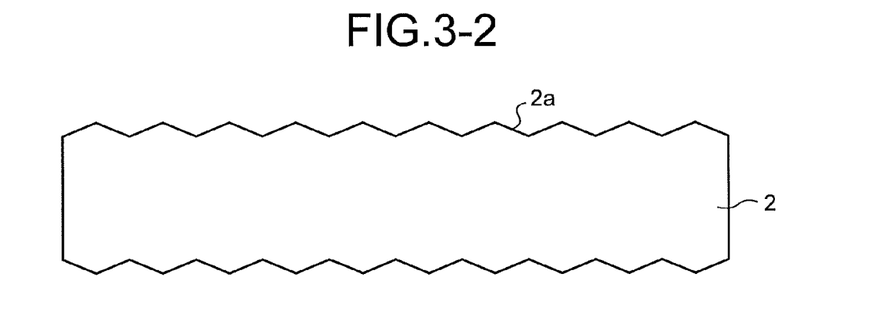

Subsequent to the damage removal, anisotropic etching of the p-type monocrystalline silicon substrate is performed with a solution in which IPA (isopropyl alcohol) is added to a similar kind of low-concentrated alkaline solution to form minute projections and recesses on the surface of the light receiving side of the p-type monocrystalline silicon substrate so that a silicon (111) plane is exposed, thereby forming a texture structure 2a (Step S10, FIG. 3-2). By providing such a texture structure on the light receiving side of the p-type monocrystalline silicon substrate, multiple reflection of light occurs on the front side of the solar cell 1, enabling inside of the semiconductor substrate 11 to efficiently absorb the light entering the solar cell 1. Therefore, the reflectance is effectively reduced, so that the conversion efficiency can be improved. When removing the damage layer and forming the texture structure with an alkaline solution, the concentration of the alkaline solution is adjusted to the concentration according to each purpose and a continuous process may be performed.

Figure 33:
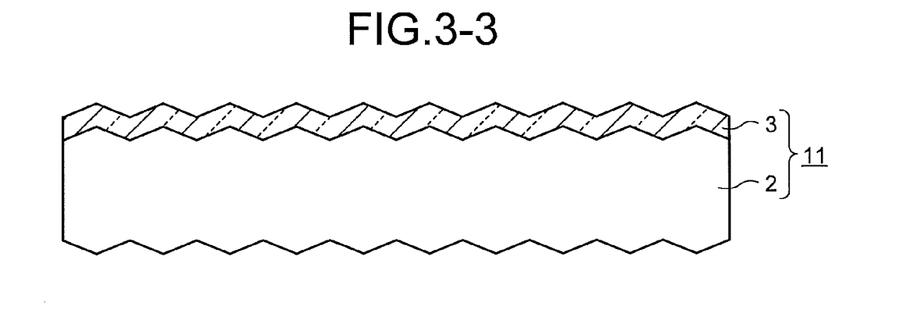

Next, the p-n junction is formed in the semiconductor substrate 2 (Step S20, FIG. 3-3). Specifically, a group-V element such as phosphorus (P) is, for example, diffused in the semiconductor substrate 2 to form the n-type impurity diffusion layer 3 with the thickness of several hundreds nm. In this embodiment, the p-n junction is formed by diffusing phosphorous oxychloride ($POCl_3$) into the p-type monocrystalline silicon substrate whose surface is provided with the texture structure, by a thermal diffusion. Consequently, the semiconductor substrate 11, in which the p-n junction is formed, is obtained by the semiconductor substrate 2 as a first conductivity-type layer made of p-type monocrystalline silicon and the n-type impurity diffusion layer 3 as a second conductivity-type layer formed on the light receiving side of the semiconductor substrate 2.

In this diffusion process, the n-type impurity diffusion layer 3, in which phosphorus (P) is diffused, is uniformly formed in the surface layer of the p-type monocrystalline silicon substrate by performing a thermal diffusion on the p-type monocrystalline silicon substrate, for example, for tens of minutes at a high temperature of 800° C. to 900° C., by a vapor phase diffusion method, for example, in a mixed gas atmosphere of phosphorous oxychloride ($POCl_3$) gas, nitrogen gas, and oxygen gas. A favorable electrical property of the solar cell is realized when the sheet resistance of the n-type impurity diffusion layer 3 formed on the surface of the semiconductor substrate 2 is in the range of about 30 Ω/☐ to 80 Ω/☐.

Because a glassy (phosphosilicate glass, PSG: Phospho-Silicate Glass) layer (not shown) deposited on the surface during the diffusion process is formed on the surface of the n-type impurity diffusion layer 3 immediately after forming the n-type impurity diffusion layer 3, the phosphorus glass layer is removed by using a hydrofluoric acid solution or the like (Step S30). Next, the sheet resistance value of the n-type impurity diffusion layer 3 after removing the phosphorus glass layer is measured at a plurality of measurement points in the surface of the n-type impurity diffusion layer 3 (Step S40)

Although not shown in the drawings, the n-type impurity diffusion layer 3 is formed on the whole surface of the semiconductor substrate 2. For eliminating the effect of the n-type impurity diffusion layer 3 formed on the back surface and the like of the semiconductor substrate 2, the n-type impurity diffusion layer 3 is left only on the light receiving side of the semiconductor substrate 2 and the n-type impurity diffusion layer 3 in other areas is removed.

For example, for protecting the n-type impurity diffusion layer 3 on the light receiving side of the semiconductor substrate 2, polymer resist paste is applied on the light receiving side of the semiconductor substrate 2 by a screen printing method and is dried. Then, the semiconductor substrate 2 is immersed, for example, in a 20 wt % potassium hydroxide solution for a few minutes to remove the n-type impurity diffusion layer 3 formed on the surface of the semiconductor substrate 2 other than the light receiving side. Thereafter, the polymer resist paste is removed by an organic solvent. Consequently, the n-type impurity diffusion layer 3 can be left only on the light receiving side of the semiconductor substrate 2. As another method of eliminating the effect of the n-type impurity diffusion layer 3 on the back surface and the like of the semiconductor substrate 2, end-face separation may be performed by laser or dry etching at the end of the process. Moreover, the n-type impurity diffusion layer 3 may be formed only on the light receiving side of the semiconductor substrate 2 in advance.

Next, the outermost layer of the n-type impurity diffusion layer 3 is slightly removed by using, for example, a nitric hydrofluoric acid solution to remove the dead layer (Step S50).

Figure 34:
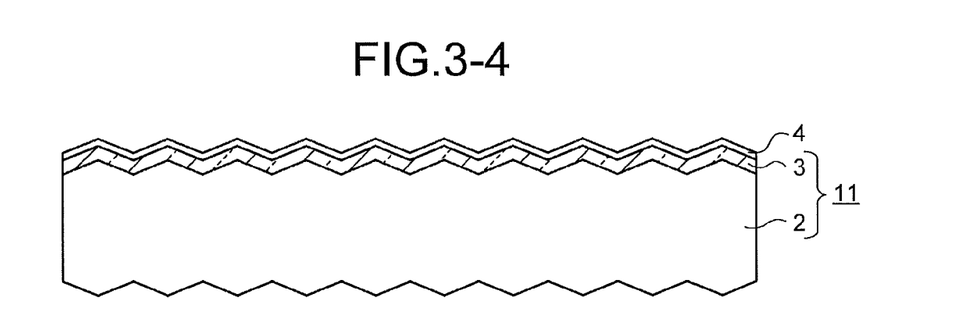

Next, for improving the photoelectric conversion efficiency, the anti-reflective film 4 is formed with a uniform thickness on the whole surface of the p-type monocrystalline silicon substrate on the light receiving side (Step S60, FIG. 3-4). The film thickness and an index of refraction of the anti-reflective film 4 are set to values with which light reflection is most strongly suppressed. For the formation of the anti-reflective film 4, for example, a silicon nitride film is formed as the anti-reflective film 4 under reduced pressure at 300° C. or higher using a mixed gas of silane ($SiH_4$) gas and ammonia ($NH_3$) gas as raw materials by using a plasma CVD method. The refractive index is, for example, about 2.0 to 2.2 and an optimum thickness of the anti-reflective film 4 is, for example, about 70 nm to 90 nm. As the anti-reflective film 4, a film having two or more layers having different refractive indexes may be stacked. Moreover, as the forming method of the anti-reflective film 4, a vapor deposition method, a thermal CVD method, or the like may be used instead of the plasma CVD method. It is to be noted that the anti-reflective film 4 formed in such a manner is an insulator, and only forming the light-receiving side electrodes 12 on this does not lead to a function as a solar cell.

Next, an electrode is formed by the screen printing method. First of all, the light-receiving side electrodes 12 are manufactured (before firing). First, the surface of the n-type impurity diffusion layer 3 is divided into a plurality of areas corresponding to the measured sheet resistance values of the surface of the n-type impurity diffusion layer 3 (Step S70). Next, the inter-grid-electrode distance, which is a distance between the adjacent front silver grid electrodes 5, is set to a value appropriate for each sheet resistance value based on the following equation (1) for each of the divisional areas (Step S80).

$$Y = -0.018 \times X + 3.2 \pm 0.3 \quad (1)$$

(X is a sheet resistance value ($\Omega/\square$) of the surface of the impurity diffusion layer and Y is a distance (mm) between the adjacent grid electrodes)

Then, the front silver grid electrodes 5 (before firing) electrically connected to the n-type impurity diffusion layer 3 are formed on the n-type impurity diffusion layer 3 according to the set inter-grid-electrode distance, and the front silver bus electrodes 6 (before firing) are formed on the n-type impurity diffusion layer 3.

Figure 5:
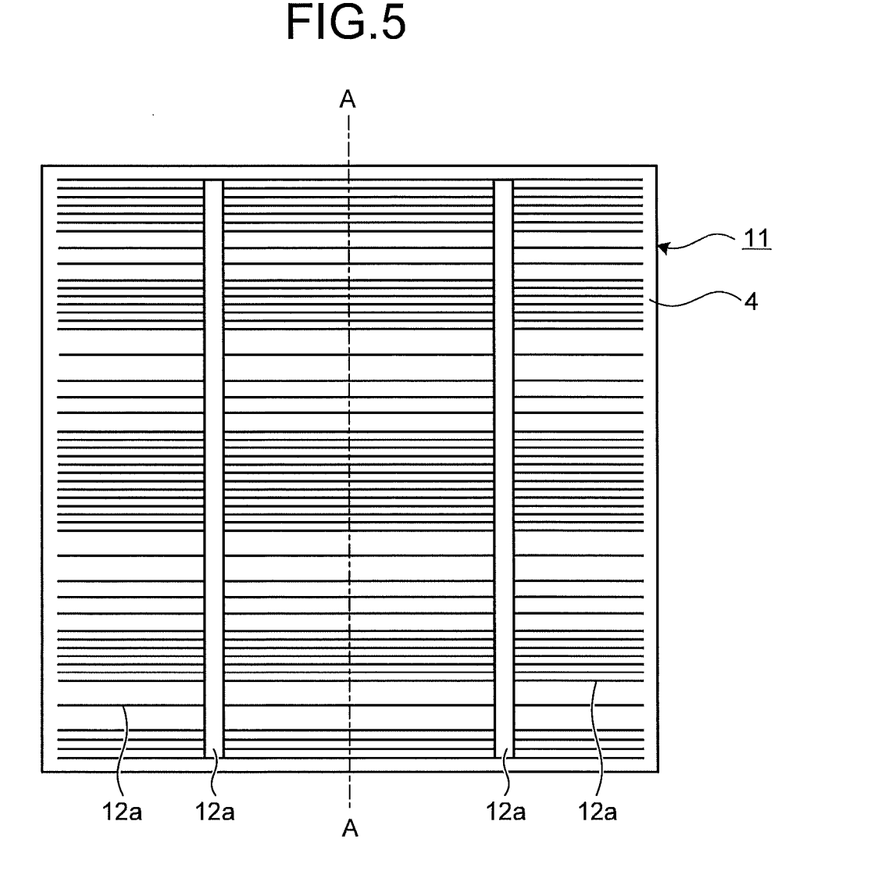
FIG. 5 is a plan view illustrating an application pattern of silver paste.
Figure 35:
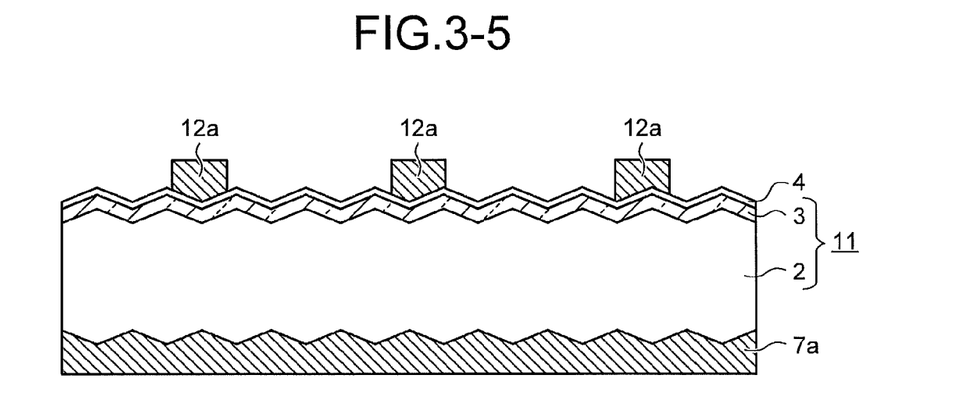

Specifically, after applying silver paste 12a, which is electrode material paste containing glass frit, to the anti-reflective film 4 serving as the light receiving surface of the p-type monocrystalline silicon substrate by the screen printing method in the form of the front silver grid electrodes 5 and the front silver bus electrodes 6, the silver paste is dried (Step S90, FIG. 3-5). The silver paste 12a is applied in the pattern as shown in FIG. 5. FIG. 5 is a plan view illustrating an application pattern of the silver paste 12a.

Figure 4:
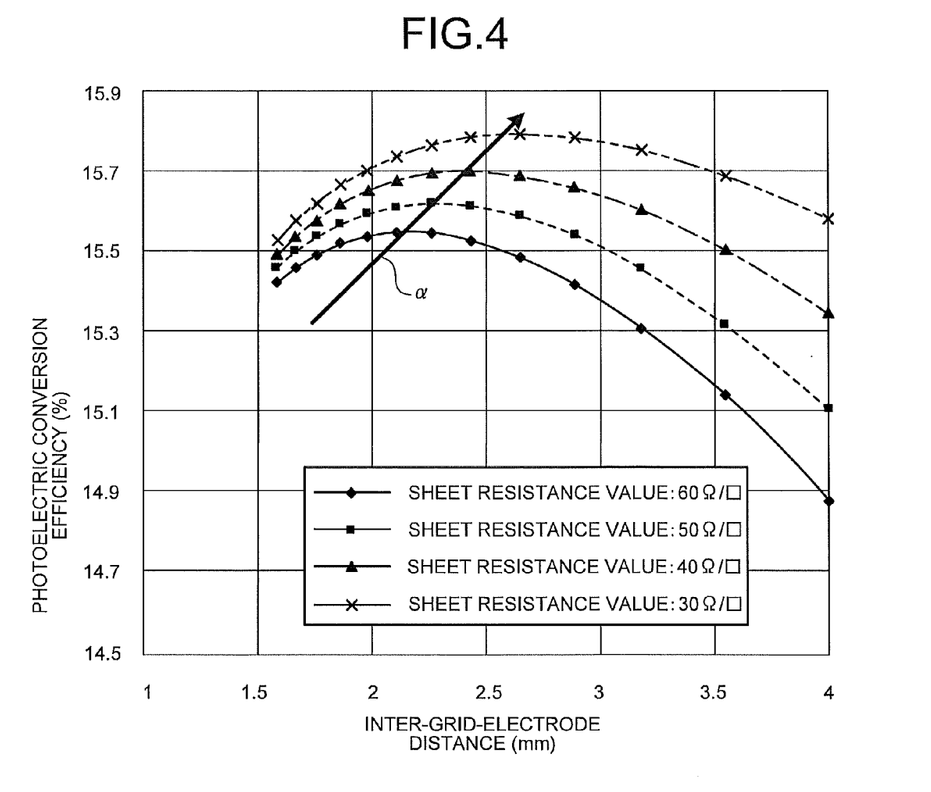
FIG. 4 is a characteristic graph illustrating a result of a simulation of relationship among a photoelectric conversion efficiency of the solar cell, an inter-grid-electrode distance, and a sheet resistance value of an n-type impurity diffusion layer.

The result of a simulation of a relationship among the photoelectric conversion efficiency of the solar cell 1, the inter-grid-electrode distance and the sheet resistance value of the n-type impurity diffusion layer 3 is shown in FIG. 4. There is a correlative relationship among the photoelectric conversion efficiency of the solar cell 1, the inter-grid-electrode distance and the sheet resistance value of the n-type impurity diffusion layer 3. In FIG. 4, a relational expression α between the sheet resistance value and the inter-grid-electrode distance with which the highest photoelectric conversion efficiency can be achieved can be derived by connecting the maximum points of the photoelectric conversion efficiencies for the respective sheet resistance values. This relational expression α is a relational expression corresponding to the above-cited equation (1). This calculation is performed under the condition where the wafer size is 156 mm×156 mm and the number of the front silver bus electrodes 6 is three. It has been confirmed by the simulation and experiment that the relationship exhibits a similar tendency when the wafer size is in the range of 145 mm×145 mm to 160 mm×160 mm and the number of the front silver bus electrodes 6 is in the range of two to five.

Next, an aluminum paste 7a, which is electrode material paste, is applied on the back side of the p-type monocrystalline silicon substrate in the form of the back aluminum electrode 7, and another silver paste 8a, which is electrode material paste, is applied thereon in the form of the back silver electrodes 8, by the screen printing method, and the pastes are dried (Step S100, FIG. 3-5). In the drawing, only the aluminum paste 7a is shown and the illustration of the silver paste 8a is omitted.

Figure 36:
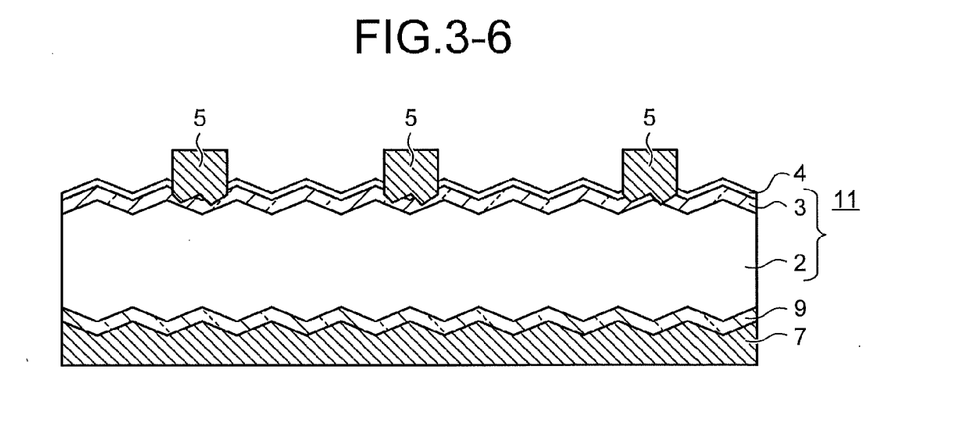

Thereafter, by firing the electrode paste on the front surface and the back surface of the semiconductor substrate 11 simultaneously, for example, at 600° C. to 900° C., a silver material comes into contact with the silicon and is re-solidified while the anti-reflective film 4 is melted by the glass material contained in the silver paste 12a on the front side of the semiconductor substrate 11. Consequently, the front silver grid electrodes 5 and the front silver bus electrodes 6 as the light-receiving side electrodes 12 are obtained, so that conduction between the light-receiving side electrodes 12 and the silicon of the semiconductor substrate 11 is secured (Step S110, FIG. 3-6). Such a process is called a fire-through method.

Moreover, the aluminum paste 7a also reacts with the silicon of the semiconductor substrate 11, so that the back aluminum electrode 7 is obtained, and the p+ layer 9 is formed immediately beneath the back aluminum electrode 7. Moreover, the silver material of the silver paste 8a comes into contact with the silicon and is re-solidified, so that the back silver electrodes 8 are obtained (FIG. 3-6). In the drawing, only the front silver grid electrodes 5 and the back aluminum electrode 7 are shown and illustration of the front silver bus electrodes 6 and the back silver electrodes 8 is omitted.

By performing the process as above, the solar cell 1 according to the embodiment shown in FIG. 1-1 to FIG. 1-3 can be manufactured. The order of arrangement of the pastes as the electrode materials to the semiconductor substrate 11 may be changed between the light receiving side and the back side.

Figure 6:
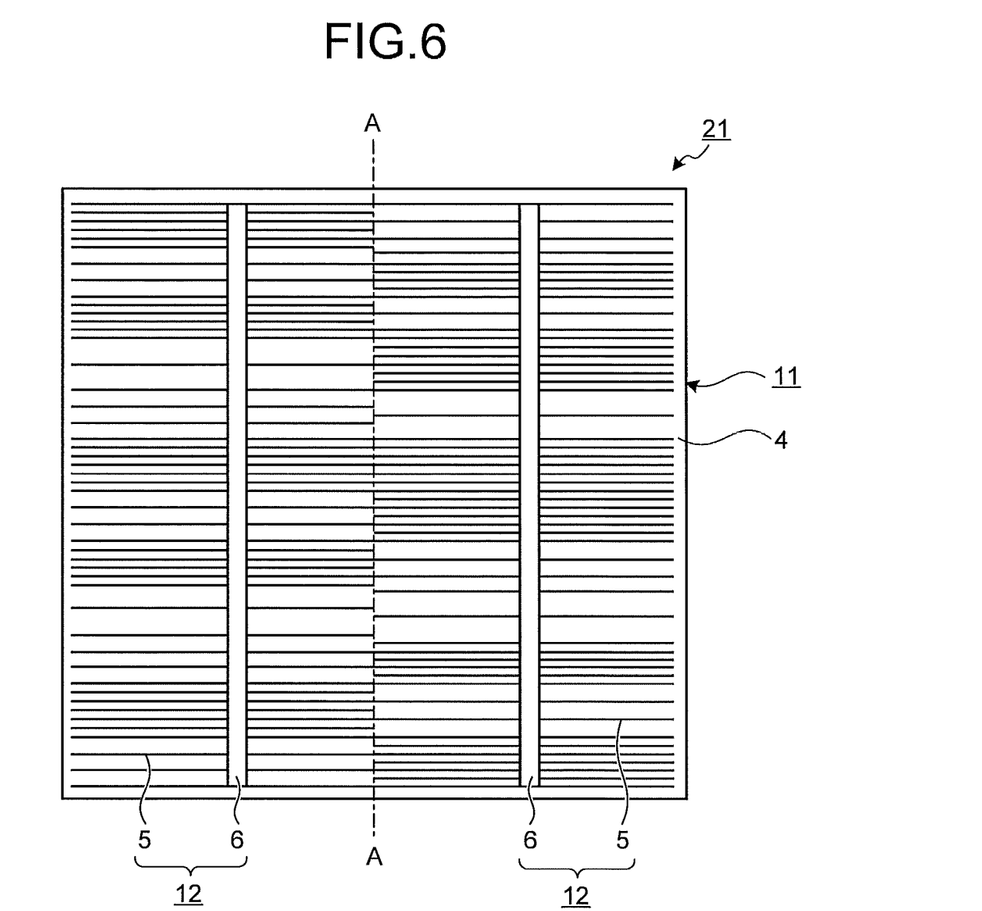
FIG. 6 is a top view of another solar cell manufactured using the manufacturing method of the solar cell according to the embodiment of the present invention, as seen from a light receiving side.
Figure 7:
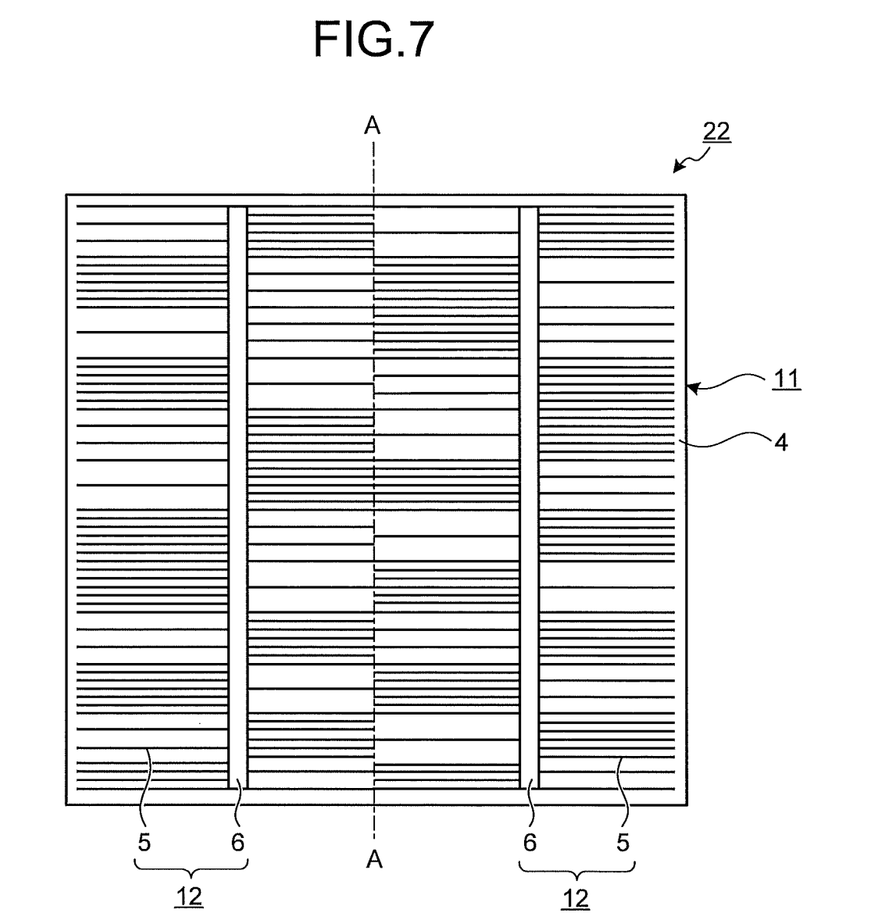
FIG. 7 is a top view of another solar cell manufactured using the manufacturing method of the solar cell according to the embodiment of the present invention, as seen from a light receiving side.

FIG. 6 and FIG. 7 are top views of other solar cells 21 and 22 manufactured by applying the manufacturing method of the solar cell 1 according to the present embodiment described above, as seen from the light receiving side. In the solar cell 21 shown in FIG. 6, the surface of the n-type impurity diffusion layer 3 is divided into a plurality of areas in the longitudinal direction of the front silver bus electrode 6 and moreover, the surface of the n-type impurity diffusion layer 3 is divided into two areas also in the longitudinal direction of the front silver grid electrodes 5. Specifically, the n-type impurity diffusion layer 3 is equally divided into two areas in the longitudinal direction of the front silver grid electrodes 5 with the intermediate position between the two front silver bus electrodes 6 serving as a boundary thereof. Then, the inter-grid-electrode distance is set for each of these divided areas based on the above equation (1). Therefore, the electrode pattern of the front silver grid electrodes 5 includes two electrode patterns equally divided in the longitudinal direction of the front silver grid electrodes 5.

Moreover, in the solar cell 22 shown in FIG. 7, the surface of the n-type impurity diffusion layer 3 is divided into a plurality of areas in the longitudinal direction of the front silver bus electrode 6 and moreover, the surface of the n-type impurity diffusion layer 3 is divided into four areas also in the longitudinal direction of the front silver grid electrodes 5. Specifically, the n-type impurity diffusion layer 3 is equally divided into four areas in the longitudinal direction of the front silver grid electrodes 5 with the two front silver bus electrodes 6 and the intermediate position therebetween serving as boundaries thereof. Then, the inter-grid-electrode distance is set for each of these divisional areas based on the above equation (1). Therefore, the electrode pattern of the front silver grid electrodes 5 includes four electrode patterns equally divided in the longitudinal direction of the front silver grid electrodes 5.

There is a correlative relationship among the photoelectric conversion efficiency of the solar cell 1, the inter-grid-electrode distance, and the sheet resistance value of the n-type impurity diffusion layer 3. Therefore, in the solar cell 21 shown in FIG. 6, by dividing the surface of the n-type impurity diffusion layer 3 into a plurality of areas also in the longitudinal direction of the front silver grid electrodes 5 and setting the inter-grid-electrode distance for each of the divisional areas based on the above equation (1), it is possible to set the inter-grid-electrode distance appropriate for each sheet resistance value more flexibly and finely corresponding to variation (in-plane distribution) in the sheet resistance value in the surface of the n-type impurity diffusion layer 3, thereby enabling to improve the photoelectric conversion efficiency. In the solar cell 22 shown in FIG. 7, it is possible to set the inter-grid-electrode distance appropriate for each sheet resistance value more flexibly and finely corresponding to variation (in-plane distribution) in the sheet resistance value in the surface of the n-type impurity diffusion layer 3 compared with the solar cell shown in FIG. 6, thereby enabling to improve the photoelectric conversion efficiency.

The electrode pattern of the front silver grid electrodes 5 may be electrode patterns equally divided into four or more areas in the longitudinal direction of the front silver grid electrode 5. Moreover, the case is illustrated in the above in which the number of the front silver bus electrodes 6 is two, but the electrode arrangement may be made different based on the similar idea even in the case where the number of the front silver bus electrodes 6 is three or more. Specifically, when the number of the front silver bus electrodes 6 is n, the electrode pattern can be equally divided into 1 to n×2 in the longitudinal direction of the front silver grid electrode 5. Even in this case, it is possible to set the inter-grid-electrode distance appropriate for each sheet resistance value more flexibly and finely corresponding to variation (in-plane distribution) in the sheet resistance value in the surface of the n-type impurity diffusion layer 3, thereby enabling to improve the photoelectric conversion efficiency.

As described above, according to the manufacturing method of the solar cell in the present embodiment, the sheet resistance value of the n-type impurity diffusion layer 3 is measured at a plurality of points in the surface of the n-type impurity diffusion layer 3, the surface of the n-type impurity diffusion layer 3 is divided into a plurality of areas corresponding to the measured sheet resistance values of the surface of the n-type impurity diffusion layer 3, and the inter-grid-electrode distance, which is the distance between the adjacent front silver grid electrodes 5, is set for each divided area based on the above equation (1), so as to form the front silver grid electrodes 5. In this way, it is possible to set the inter-grid-electrode distance flexibly and finely in accordance with variation (in-plane distribution) in the sheet resistance value in the surface of the n-type impurity diffusion layer 3, thereby enabling to improve the photoelectric conversion efficiency.

Thus, according to the manufacturing method of the solar cell in the present embodiment, it is possible to easily manufacture a solar cell excellent in photoelectric conversion efficiency, in which variation (in-plane distribution) in the sheet resistance value in the surface of the n-type impurity diffusion layer 3 is considered and decrease in the photoelectric conversion efficiency due to variation (in-plane distribution) in the sheet resistance value in the surface of the n-type impurity diffusion layer 3 is prevented.

INDUSTRIAL APPLICABILITY

As above, the manufacturing method of the solar cell according to the present invention is useful for manufacturing of a solar cell in which variation (in-plane distribution) in a sheet resistance value in a surface of an impurity diffusion layer is considered.

REFERENCE SIGNS LIST

1 SOLAR CELL
2 SEMICONDUCTOR SUBSTRATE
2a TEXTURE STRUCTURE
3 n-TYPE IMPURITY DIFFUSION LAYER
4 ANTI-REFLECTIVE FILM
5 FRONT SILVER GRID ELECTRODE
6 FRONT SILVER BUS ELECTRODE
7 BACK ALUMINUM ELECTRODE
7a ALUMINUM PASTE
8 BACK SILVER ELECTRODE
8a SILVER PASTE
9 p+ LAYER (BSF)
11 SEMICONDUCTOR SUBSTRATE
12 LIGHT-RECEIVING SIDE ELECTRODE
12a SILVER PASTE

13 BACK SIDE ELECTRODE
21 SOLAR CELL
22 SOLAR CELL

The invention claimed is:

1. A manufacturing method of a solar cell in which a light receiving side electrode including grid electrodes is provided on one side of a semiconductor substrate, comprising:
   a first step of forming an impurity diffusion layer on one side of the semiconductor substrate of a first conductivity type, the diffusion layer having a second conductivity-type impurity diffused therein;
   a second step of measuring a sheet resistance value of the impurity diffusion layer at a plurality of measurement points in a surface of the impurity diffusion layer; and
   a third step of dividing the surface of the impurity diffusion layer into a plurality of areas corresponding to the measured sheet resistance values of the surface of the impurity diffusion layer, setting a distance between adjacent grid electrodes for each of the areas, and forming the grid electrodes, which are electrically connected to the impurity diffusion layer, on the impurity diffusion layer based on the areas corresponding to the measured sheet resistance values.

2. The manufacturing method of a solar cell according to claim 1, wherein, as the sheet resistance value of the impurity diffusion layer, the sheet resistance value of the surface of the impurity diffusion layer is measured when the impurity diffusion layer is formed in the first step.

3. The manufacturing method of a solar cell according to claim 1, further comprising a glassy layer removing step of removing a glassy layer formed on the surface of the impurity diffusion layer, between the first step and the second step, wherein
   as the sheet resistance value of the impurity diffusion layer, the sheet resistance value of the surface of the impurity diffusion layer is measured when the glassy layer is removed in the glassy layer removing step.

4. The manufacturing method of a solar cell according to claim 1, further comprising a glassy layer removing step of removing a glassy layer formed on the surface of the impurity diffusion layer and a surface layer removing step of removing a surface layer of the impurity diffusion layer, between the first step and the second step, wherein
   as the sheet resistance value of the impurity diffusion layer, the sheet resistance value of the surface of the impurity diffusion layer is measured when the surface layer of the impurity diffusion layer is removed in the surface layer removing step.

5. The manufacturing method of a solar cell according to claim 1, wherein, in the third step, for each area, the distance between adjacent grid electrodes is set based on the following equation (1):

$$Y = -0.018 \times X + 3.2 \pm 0.3 \qquad (1)$$

where X is a sheet resistance value ($\Omega/\square$) of the surface of the impurity diffusion layer and Y is a distance (mm) between adjacent grid electrodes.

6. The manufacturing method of a solar cell according to claim 1, further comprising an anti-reflective film forming step of forming an anti-reflective film on the impurity diffusion layer, wherein
   in the third step, the grid electrodes, which are electrically connected to the impurity diffusion layer with penetrating the anti-reflective film, are formed.

7. The manufacturing method of a solar cell according to claim 1, wherein
   the light-receiving side electrode includes a bus electrode wider than the grid electrode and a longitudinal direction of the bus electrode and a longitudinal direction of the grid electrode intersect substantially orthogonally with each other in a plane of the semiconductor substrate, and
   in the third step, the surface of the impurity diffusion layer is divided into a plurality of areas in the longitudinal direction of the bus electrode and the surface of the impurity diffusion layer is divided into a plurality of areas in the longitudinal direction of the grid electrode.

8. The manufacturing method of a solar cell according to claim 7, wherein, in the third step, where the number of the bus electrodes is n, the impurity diffusion layer is divided into the areas obtained by equally dividing the diffusion layer into 1 to n×2 in the longitudinal direction of the bus electrode.

9. The manufacturing method of a solar cell according to claim 8, wherein the number of the bus electrodes is two or more.

* * * * *